(12) United States Patent
Kunert et al.

(10) Patent No.: US 8,421,055 B2
(45) Date of Patent: Apr. 16, 2013

(54) III/V-SEMICONDUCTOR

(75) Inventors: Bernardette Kunert, Marburg (DE);
Jorg Koch, Dautphetal (DE); Stefan Reinhard, Rauschenberg-Bracht (DE);
Kerstin Volz, Dautphetal (DE);
Wolfgang Stolz, Marburg (DE)

(73) Assignee: Philipps-University Marburg (DE)

( * ) Notice: Subject to any disclaimer, the term of this patent is extended or adjusted under 35 U.S.C. 154(b) by 578 days.

(21) Appl. No.: 12/472,224

(22) Filed: May 26, 2009

(65) Prior Publication Data
US 2010/0102293 A1    Apr. 29, 2010

Related U.S. Application Data

(63) Continuation of application No. 11/342,287, filed on Jan. 26, 2006, now abandoned.

(60) Provisional application No. 60/647,106, filed on Jan. 26, 2005.

(51) Int. Cl.
*H01L 33/00* (2010.01)

(52) U.S. Cl.
USPC ....... 257/13; 257/615; 257/E33.008; 438/478

(58) Field of Classification Search ............ 257/13, 257/615, E29.089, E33.008, E21.158, E33.067, 257/E21.09; 438/29, 46, 478
See application file for complete search history.

(56) References Cited

U.S. PATENT DOCUMENTS

| 5,300,789 A | 4/1994 | Gorfinkel et al. |
| 5,825,796 A | 10/1998 | Jewell et al. |
| 5,937,274 A * | 8/1999 | Kondow et al. ............... 438/47 |
| 6,072,196 A | 6/2000 | Sato |

(Continued)

FOREIGN PATENT DOCUMENTS

| EP | 0297483 A2 | 1/1989 |
| EP | 0380815 B1 | 5/1994 |

(Continued)

OTHER PUBLICATIONS

Takashi Ishizuka, et al., "Considerable Improvement of Optical Property of GaInNAs/GaAs Quantum Well", Journal of Crystal Growth, 2004, vol. 272, pp. 760-764.

(Continued)

*Primary Examiner* — Roy Potter
(74) *Attorney, Agent, or Firm* — Kevin L. Williams; Mayer & Williams PC

(57) ABSTRACT

The invention relates to a monolithic integrated semiconductor structure comprising a carrier layer on the basis of doped Si or doped GaP and a III/V semiconductor disposed thereupon and having the composition $Ga_xIn_yN_aAs_bP_cSb_d$, wherein x=70-100 mole-%, y=0-30 mole-%, a=0.5-15 mole-%, b=67.5-99.5 mole-%, c=0-32.0 mole-% and d=0-15 mole-%, wherein the total of x and y is always 100 mole-%, wherein the total of a, b, c and d is always 100 mole-%, and wherein the ratio of the totals of x and y on the one hand, and of a to d on the other hand, is substantially 1:1, to methods for the production thereof, new semiconductors, the use thereof for the production of luminescence diodes and laser diodes or also modulator and detector structures, which are monolithically integrated in integrated circuits on the basis of the Si or GaP technology.

36 Claims, 5 Drawing Sheets

U.S. PATENT DOCUMENTS

| | | | |
|---|---|---|---|
| 6,130,147 A * | 10/2000 | Major et al. | 438/604 |
| 6,233,264 B1 | 5/2001 | Sato | |
| 6,479,312 B1 | 11/2002 | Yamada et al. | |
| 6,813,295 B2 | 11/2004 | Takeuchi et al. | |
| 6,879,614 B2 * | 4/2005 | Sato | 372/45.01 |
| 7,881,357 B2 * | 2/2011 | Takahashi | 372/50.124 |
| 2003/0013223 A1 | 1/2003 | Ramdani et al. | |
| 2003/0179801 A1 | 9/2003 | Takeuchi et al. | |
| 2004/0084667 A1 | 5/2004 | Takahashi | |
| 2004/0135136 A1 | 7/2004 | Takahashi et al. | |
| 2004/0161009 A1 | 8/2004 | Edamura et al. | |

FOREIGN PATENT DOCUMENTS

| | | |
|---|---|---|
| EP | 0896406 A2 | 2/1999 |
| EP | 1257026 A2 | 11/2002 |
| EP | 1553670 A2 | 7/2005 |

OTHER PUBLICATIONS

J.L. Merz, et al., "Exciton Localisation in InGaAsN and GaAsSbN Observed by Near-Field Magnetoluminescence and Scanning Optical Microscopy (NSOM)", IEE Proc. Optoelectron., Oct. 2004, vol. 151, No. 5, pp. 346-351.

* cited by examiner

III/V-SEMICONDUCTOR

STATEMENT OF RELATED APPLICATIONS

This is a continuation of U.S. patent application Ser. No. 11/342,287, filed Jan. 26, 2006, now abandoned entitled "III/V-Semiconductor," which claims the benefit of U.S. Provisional Patent Application No. 60/647,106, filed Jan. 26, 2005. Each of the prior applications is incorporated by reference in its entirety herein.

FIELD OF THE INVENTION

The invention relates to a new III/V semiconductor, a semiconductor layer consisting of such a semiconductor, a monolithically integrated semiconductor structure comprising such a semiconductor layer, the uses of such a semiconductor or of such a semiconductor layer, and a method for the production of such a semiconductor layer.

BACKGROUND OF THE INVENTION

In the field of computer technology, there is a continuously growing demand for higher processing and signal conduction capacities in conjunction with a high reliability and flexibility. In the past, chip technology has made a rapid progress with regard to integration density and working speeds or cycle frequencies. With this trend further advancing, problems are coming up for the connection of fast chips. Critical aspects in conjunction with high-speed connections are reliability, cost, on-chip driver size and performance, crosstalk, signal distortions and lack of flexibility in the chip design. Connections between chips by using opto-electronic components and optical waveguides are a solution for many connection problems. Optical connections have an extremely high bandwidth and are comparatively insensitive against crosstalk and other interferences. By using these properties of optical connections, it may become possible to connect high-speed chips with each other by optical channels and to achieve a considerable improvement with regard to connection density, current consumption, interferences and crosstalk.

Usually high-integrated circuits are based on the Si technology. Silicium is however an indirect semiconductor, and the production of efficient optoelectronic components using the Si technology is consequently essentially impossible. Efficient optoelectronic components can however be produced by using the technology of the III/V semiconductors, for instance the GaAs technology, since these semiconductors are often direct semiconductors, consequently emitting and absorbing light with a high efficiency.

For producing integrated circuits, the epitaxial process is commonly employed. If now contacts between layers on the basis of the Si technology and layers on the basis of the technology of the III/V semiconductor are to be made, it is problematic that the lattice constants of the respective materials are different (this also applies to GaP substrates instead of Si substrates). Consequently, during the epitaxial growth of III/V semiconductors on Si (or GaP) substrates, dislocations are created. Such dislocations, however, disturb the function of the complete semiconductor structure to a substantial degree, particularly since the functional layer thicknesses today are on the order of atomic dimensions. In the case of high layer thicknesses, the difference of the lattice constants even leads to bends of the substrate. The reason for this is basically that with high deposition temperatures, an epitaxial growth of III/V semiconductors takes place on Si or GaP semiconductors, however the generation of dislocations begins already at lower deposition temperatures. If then the semiconductor structure cools down to ambient temperature, the differences of the lattice constants caused by the different thermal expansion coefficients will lead to the above stresses and dislocations.

Various approaches exist to eliminate the aforementioned problems. EP 0380815 B1 describes that GaAs layers can be deposited on a Si substrate and form defined microcracks at predetermined positions, thus dislocations of the Si substrate may be avoided, or at least reduced. However, this technology is not suitable for high-integrated circuits because it lacks controllability of microcracks in atomic scales.

EP 0297483 describes a hybrid integrated semiconductor structure, wherein an integrated circuit on the basis of the Si technology is applied to a Si substrate. Further, an optically active element in GaAs technology is provided on the Si substrate. However, an electrical connection between the integrated circuit and the optically active element is not established by a direct contact or by the Si substrate, but rather by an electrical wire connection. This technology is also not suitable for applications in high-integrated circuits.

From the document DE 10355357 it is known, for layer structures with optically active elements on the basis of III/V semiconductors, to compensate dislocations caused by lattice constants, for instance by adaptation layers subjected to tensile stress. By currently known measures, a modeling of electronic properties is also possible, and thus previously inaccessible emission wavelengths become accessible.

US 2004/0135136 A1 describes, a multitude of different III/V semiconductors known in the art, and they are always layers, which are not suitable for application on a Si substrate. Corresponding considerations apply to documents EP 1257026 A2, U.S. Pat. No. 6,233,264 B1, US 2004/0084667 A2, Merz et al., IEE Proc.-Optoelectron. 151(5):346-351 (2004), U.S. Pat. No. 6,072,196, EP 1553670 A2, U.S. Pat. No. 5,825,796, Ishizuka et al., Journal of Crystal Growth 272:760-764 (2004) and US 2004/0161009 A1.

EP 0896406 A2 describes layers of optically active III/V semiconductors on GaP or Si substrates (and others), and these layers contain exclusively In as the III component. In fact, such layers are only suitable for InP substrates and form undesirably many dislocations and faults on Si or GaP substrates. U.S. Pat. No. 5,937,274 describes, in a very general manner, different layers on different substrates.

As a result, the need continues, particularly in the field of high-integrated circuits, to connect subassemblies or layer sequences on the basis of the Si technology and on the basis of the III/V semiconductor monolithically with each other.

TECHNICAL OBJECT OF THE INVENTION

It is a technical object of the invention to propose a means for providing optically active elements on the basis of the III/V semiconductors on substrates of the Si technology or GaP technology, wherein the conduction of electrical signals of the Si based or GaP-based subassemblies to and from the optically active elements is integrally formed, i.e. by contact of layers, practically free from dislocations forming nonradiative recombination centers in the III/V semiconductor or at the border face thereof to the layer underneath. It is further a technical object of the invention to propose stable luminescence and laser components on Si substrates or GaP substrates, which are directly contacted, i.e. by layer contact. It is another technical object of the invention to provide a monolithically integrated semiconductor structure, which emits directly, i.e. without wire-bound connection lines, data currents from a Si-technology based processor circuitry as an optical signal. Further, it is a technical object of the invention to propose a monolithically integrated semiconductor structure, by means of which emitted optical signals can also be modulated and/or detected.

DETAILED DESCRIPTION OF THE PREFERRED EMBODIMENTS

Figure 1:
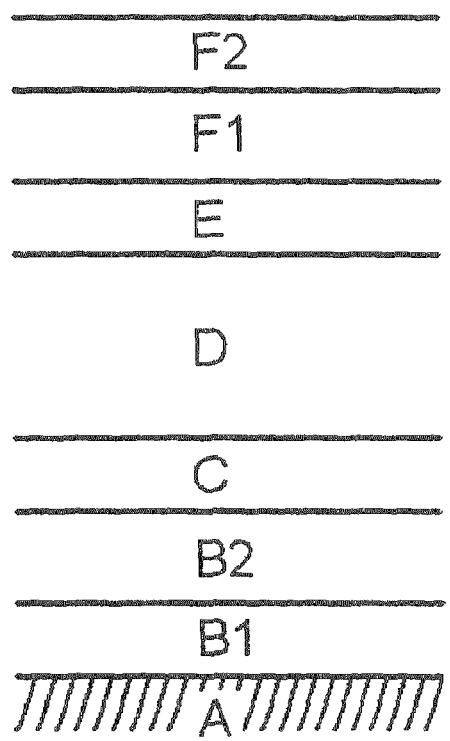
FIG. 1 is a monolithic integrated semiconductor structure according to the invention.

For achieving this technical object, the invention teaches monolithically integrated semiconductor structures according to claim 1, with Si or GaP substrates and a III/V semiconductor having the composition $Ga_x In_y N_a As_b P_c Sb_d$, wherein x=70-100 mole-%, y=0-30 mole-%, a=0.5-15 mole-%, b=67.5-99.5 mole-%, c=0-32.0 mole-% and d=0-15 mole-%, wherein the total of x and y is always 100 mole-%, wherein the total of a, b, c and d is always 100 mole-%, and wherein the ratio of the totals of x and y on the one hand, and of a to d on the other hand, is substantially 1:1. Preferably, y=1-30 mole-%, and c=1-32.0 mole-%, and such a semiconductor per se.

In the case of a P-free system, In and/or Sb should be comprised, since these elements minimize, like P, the local distortion fields caused by the N-incorporation.

III/V semiconductors having the following compositions are particularly preferred:

a) x=70-100 mole-%, y=0-30 mole-%, a=0.5-10 mole-%, b=70-98.5 mole-%, c=1-29.5 mole-%, or b) x=85-99 mole-%, y=1-15 mole-%, a=0.5-10 mole-%, b=70-98.5 mole-%, c=1-29.5 mole-%, or c) x=85-99 mole-%, y=1-15 mole-%, a=0.5-10 mole-%, b=70-98.5 mole-%, c=0-32 mole-% and d=1-10 mole-%.

In particular, x=>70-100 mole-%, a=>1.3 or >1.7 mole-% (optionally in connection with y>0 or 1 mole-%), c=0-32 mole-% and/or b=60-99.5 mole-%. Preferred is also c= or between 4-8 mole-%. Preferred is also a=4 or 5.5-11 mole-%.

The semiconductor class according to the invention of the mixed crystal system GaInNAsPSb is characterized, on the one hand, by that because of the composition, presumably of the addition of nitrogen and/phosphorus, layer sequences adapted to the lattice or compressively stressed can be produced on GaP and/or Si substrates, without causing dislocations. On the other hand, beginning from a nitrogen concentration of >0.5 mole-% in conjunction with the phosphorus content, an interaction of the electronic levels caused by the incorporation of nitrogen with the conduction band states of the nitrogen-free mixed crystal system at the Γ point will occur, which will lead to an effective red shift of the fundamental energy gap at the Γ point and thus strengthen the character as a direct semiconductor of the GaInNAsPSb material system. For instance, for a=1-10 mole-%, b=60-95 mole-% and c=2-15 mole-%, preferably a=3-5 mole-%, b=85-95 mole-% and c=4-8 mole-%, a fundamental energy gap of distinctly less than 1.8 eV will result, even down to 1.4 eV and smaller. This makes clear the drastic influence of the energy gap by the composition of this semiconductor system according to the invention.

In detail, the invention relates to a monolithically integrated semiconductor structure comprising the following layer structure:

A) a carrier layer on the basis of doped or undoped Si or GaP,

B) as an option, a first current-conducting layer composed of doped Si, doped GaP or doped (AlGa)P, C) as an option, a first adaptation layer, and D) an optically active element comprising a semiconductor layer according to the invention.

To the layer D), the layers below may follow:

E) optionally, a second adaptation layer and

F) a second current-conducting layer composed of doped Si or doped GaP or doped (AlGa)P. In case of the (AlGa)P, the share of Al may be 20-100 mole-%, and the total of the shares of Al and Ga is always 100 mole-%. The layer B) may be p or n-doped. In case that the layer F) is present, the layer F) may be p-doped, if layer B) is n-doped, and vice versa.

Normally, the optical element will have a layer structure $(D1-D2-D3)_n$, wherein the layer D2 is a quantum well layer of a semiconductor according to the invention, wherein the layers D1 and D3 are barrier layers, and wherein n=1-15. By such an optically active element, luminescence diodes as well as laser diodes can be built up. Following one of the terminal layers D1 or D3, a barrier layer D4 may be provided. It may be recommended that the barrier layers are semiconductors having the composition $Ga_p In_q N_r P_s As_t$, wherein p=85-100 mole-%, q=0-15 mole-%, r=0-15 mole-%, s=60-100 mole-% and t=0-40 mole-%, wherein the total of p and q is always 100 mole-%, wherein the total of r, s and t is always 100 mole-%, and wherein the ratio of the totals of p and q on the one hand, and of r to t on the other hand, is substantially 1:1, and wherein the barrier layer has a layer thickness of preferably 5-50 nm. Preferred ranges are: p=90-100 mole-%, q=0-10 mole-%, r=0-10 mole-%, s=70-100 mole-% and t=0-30 mole-%. For the layer thickness, a range of 2-20 nm is preferred. An adaptation layer may be a semiconductor having the composition $Ga_p In_q N_r P_s As_t$, wherein p=90-100 mole-%, q=0-10 mole-%, r=0-10 mole-%, s=70-100 mole-% and t=0-30 mole-%, wherein the total of p and q is always 100 mole-%, wherein the total of r, s and t is always 100 mole-%, and wherein the ratio of the totals of p and q on the one hand and of r to t on the other hand is substantially 1:1, and wherein the adaptation layer has a layer thickness of preferably 50-500 nm.

In the monolithically integrated semiconductor structure according to the invention, a current-conducting layer and/or barrier layer disposed between the carrier layer and the optically active element may be, at the same time, an adaptation layer.

Underneath and/or above the optically active element, at least one optical waveguide layer may be provided, which is optically coupled to the optically active element. In this way, data currents can be guided as optical signals from the emitting optically active element to an optical receiver at a different place on the carrier. It is understood that other elements may additionally or alternatively be used for conducting optical signals, such as fibers or the like.

A luminescence diode or a vertically emitting laser diode may be produced between the layers A) and D) and/or outside the layer F), wherein there is provided at least one periodic reflection structure.

Preferably, the optically active element has a fundamental emission wavelength in the range of 700-1,100 nm.

The invention further relates to the use of a semiconductor according to the invention, or a semiconductor layer according to the invention for the production of a luminescence diode (LED), a VCSEL (vertical cavity surface emitting laser) laser diode or a VECSEL (vertical external cavity surface emitting laser) laser diode and a modulator or a detector structure.

Finally, the invention relates to a method for the production of a semiconductor layer according to the invention comprising the following steps: a substrate on the basis of doped or undoped Si or GaP is brought into a MOVPE (metal-organic vapor phase epitaxy) apparatus, optionally, a surface of the substrate is provided in at least one epitaxial coating step first with respectively at least one adaptation layer, one barrier layer, one current-conducting layer, one waveguide layer and/or one reflection structure, a carrier gas is loaded with educts in defined concentrations, the loaded carrier gas is conducted over the surface of the substrate heated to a temperature in the range of 300° C. to 700° C. or on the surface of the uppermost layer on the substrate for a defined duration of exposure, and the total concentration of the educts and the duration of exposure are adjusted to each other such that the semiconductor layer is epitaxially formed with a given layer thickness on the surface of the substrate or on the surface of the uppermost layer on the substrate.

Preferably, the following educts are used for the MOVPE technology: C1-C5 trialkylgallium, in particular triethylgallium ($Ga(C_2H_5)_3$) and/or trimethylgallium ($Ga(CH_3)_3$), as a Ga educt, C1-C5 trialkylindium, in particular trimethylindium ($In(CH_3)_3$), as an In educt, ammonia ($NH_3$), mono(C1-C8)alkylhydrazine, in particular tertiarybutylhydrazine (t-($C_4H_9$)—NH—$NH_2$), and/or 1,1-di(C1-C5)alkylhydrazine, in particular 1,1-dimethylhydrazine (($CH_3$)$_2$—N—$NH_2$), as an N educt, arsine ($AsH_3$) and/or C1-C5 alkylarsine, in particular tertiarybutylarsine (t-($C_4H_9$)—$AsH_2$), as an As educt, phosphine ($PH_3$) and/or C1-C5 alkylphosphine, in particular tertiarybutylphosphine (t-($C_4H_9$)—$PH_2$), as a P educt, and C1-C5 trialkylantimony, in particular trimethylantimony (($CH_3$)$_3$Sb) and/or triethylantimony (($C_2H_5$)$_3$Sb), as an Sb educt, wherein the C3-C5 alkyl groups may be linear or branched.

Preferably, the educts are employed in the following molar ratios: As educt/group III educts 5-300, P educt/group-III educts 0-500, N educt/As educt 0.1-10, optionally Sb educt/As educt 0-1, wherein the surface temperature of the substrate is adjusted to the range from 500° C. to 630° C., wherein the total pressure of carrier gas and educts is adjusted to the range from 10 to 1,000 hPa or to 200 hPa, wherein the ratio of the total of the partial pressure of all educts to the partial pressure of the carrier gas is between 0.005 and 0.1, and wherein the deposition rate is 0.1 to 10 μm/h. In particular the following ratios may be employed: As educt/group III educts 10-100, for instance 10-30, P educt/group III educts 1-100, for instance 1-10, N educt/As educt 1-10, for instance 3-8. The surface temperature may preferably be in the range from 500° C. to 650° C., in particular 550° C. to 600° C. The total pressure of carrier gas and educts may be in the range from 20 to 100 hPa. The ratio of the partial pressure of all educts to the partial pressure of the carrier gas may be in the range from 0.01 to 0.05. The deposition rate may be between 0.1 and 5 μm/h, in particular 0.5 and 3 μm/h.

In principle, the precise concentrations of the educts depend on the thermal decomposition properties of the respective educts in the MOVPE process. The growth speed of the layer is determined by the concentrations of the group III educts. On the basis of various decomposition properties of the Ga and if applicable In educts, known to one skilled in the art, depending on the selected deposition temperature (surface temperature of the substrate), suitable educt concentrations are adjusted, which will lead to the desired group III concentrations of the respective elements in the semiconductor layer according to the invention. Because of the known temperature-dependent incongruent vaporization of the group V educts or species of the growth surface of the III/V semiconductors, the respective group V educt concentrations in the MOVPE deposition should carefully be adjusted to the desired concentrations in the semiconductor layer according to the invention as a function of the selected deposition temperature in the excess. This is easily achievable for one skilled in the art. For higher deposition temperatures or educts that cannot easily be decomposed, if applicable, higher V/III ratios, but also higher N/As ratios than mentioned above, have to be selected. For lower deposition temperatures, correspondingly the reversed behavior applies.

Alternatively to MOVPE, of course other epitaxial methods can also be employed, such as MBE (molecular beam epitaxy), also under inclusion of gas sources in particular for the group V components (gas source MBE, GS-MBE), CBE (chemical beam epitaxy) or also MOMBE (metal-organic molecular beam epitaxy). These methods can be carried out by means of the usual and per se known epitaxy apparatuses, and the respectively suitable and per se known educts and sources have to be employed. The respective conditions can easily be adjusted by one skilled in the art.

A method for the production of a semiconductor structure according to the invention is described in claims 22 to 33.

DEFINITIONS

A direct semiconductor is a semiconductor, where in the band structure, the valence band maximum and the conduction band minimum are located opposite to each other at the same crystal pulse vector. In contrast thereto, for an indirect semiconductor, the valence band maximum and the conduction band minimum are not located opposite to each other at the same crystal pulse vector, but are located at different crystal pulse vectors.

A monolithic semiconductor structure is a structure, wherein an electric contact of different functional semiconductor sections occurs by (preferably epitaxial) layers immediately connected with each other. In contrast thereto, in a hybrid semiconductor structure, an electrical contact of different functional semiconductor sections is achieved by auxiliary connections, such as, for instance, wire connections.

In an n-doped semiconductor, the electrical conduction is achieved by electrons because of donor atoms having extra valence electrons. For the n-doping of silicon, nitrogen, phosphorus, arsenic and antimony can be used, for instance. For the n-doping of GaP or (AlGa)P semiconductors, silicon and tellurium can be used, for instance. In a p-doped semiconductor, the electrical conduction occurs by holes because of the incorporation of acceptor atoms. Acceptors for silicon are boron, aluminum, gallium and indium. For GaP or (AlGa)P, magnesium, zinc or carbon can be used as acceptors, for instance.

A semiconductor is typically undoped, if the concentration of donor or acceptor atoms is below $10^5$ $cm^{-3}$. Doped semiconductors usually have concentrations above $10^{15}$ $cm^{-3}$.

A current-conducting layer consists of a semiconductor doped to such an extent that a conductivity sufficient to provide a defined electrical power is given.

III/V semiconductors according to the invention are typically compressively stressed. For the purpose of the lattice adaptation and modeling of the band structure, barrier layers are provided, which may be tensile-stressed. Thereby, a compensation of the stress of the III/V semiconductor is achieved.

An optically active element according to the invention transforms energy into light radiation and emits the latter, modulates the light radiation and/or absorbs light radiation and transforms it into an electrical signal. For laser diodes, the number of layer periods n is typically 1-5. For luminescence diodes, n may however be up to 15. For modulators or detector structures, n may be substantially higher and have values of up to 50 and more.

An adaptation layer serves for the compensation of stresses of a semiconductor layer or a semiconductor structure according to the invention on the basis of III/V semiconductors on Si or GaP substrates. Adaptation layers do not contribute to light emission.

A quantum well layer is also called a quantum film. By the two-side contact with a barrier layer, the movements of the charge carriers are confined, and the charge carriers are in the case of epitaxial layers in a one-dimensional inclusion (movements mainly in two spatial dimensions). Optically active elements having the layer structure according to the invention are also called multiple quantum well (MQW) structures. By epitaxial stresses between the quantum well layers and the barrier layers, the electronic properties with regard to the fundamental band gap can be influenced.

Optical waveguide layers are widely known in the art. As an example only, reference is made to the document "Semiconductor Optoelectronics: Physics and Technology", J. Singh, McGraw-Hill Inc., New York (1995).

Periodic reflection structures are dielectric and/or epitaxial ($\lambda/4$) multi-layer mirrors. They are so-called distributed Bragg reflectors (DBR), reflecting the light emitted by the optically active element and representing thus the high-reflective end mirror in the laser resonator. With regard thereto, reference is made to the document "Vertical-cavity Surface-emitting Lasers: Design, Fabrication, Characterization and Application", Eds.: C. Wilmsen et al., Cambridge University Press, Cambridge (1999). Such periodic reflection structures may also be p or n-doped for the purpose of current conduction. Then these periodic reflection structures accept at the same time the function of a current-conducting layer.

III/V semiconductors according to the invention are typically metastable at room temperature or at operating temperature. This means that because of the thermodynamics of the situation at the respective temperature, there should not exist a stable, homogeneous phase, but that a decay into at least two different phases should occur. This decay is, however, kinetically inhibited. For overcoming the kinetic inhibition, a high temperature would be required to act, and for this reason such metastable phases can only be epitaxially deposited at comparatively low substrate temperatures, typically below 700° C. After the deposition at reduced temperatures, an annealing step of the semiconductor layer according to the invention may be employed in the temperature range of typically 700° C. to 850° C. for the reduction of nonradiative recombination centers. There can be performed equilibrium annealing steps, for instance immediately in a MOVPE reactor, as well as non-equilibrium methods, such as rapid thermal annealing (RTA). The respective annealing temperatures are to be selected such that no decay into different phases is observed.

The carrier layer used according to the invention is typically a GaP or Si single crystal. It is understood that the surface of such a single crystal may be purified in a conventional manner and prepared for the epitaxial deposition. In this context, reference is made to the document A. Ishizaka et al., Electrochem. Soc. 33:666 (1986).

The term "substantially 1:1" comprises the range of 0.8:1.2-1.2:0.8, in particular 0.9:1.1-1.1:0.9, preferably 0.95:1.05-1.05:0.95, and of course also exactly 1:1.

Example 1

Production of a Semiconductor Layer According to the Invention

After the usual pretreatment, a Si wafer (manufacturer: Wacker, Va. Semiconductor) is placed in a MOVPE apparatus (type AIX200-GFR, manufacturer Aixtron). First, epitaxial layers are deposited in a conventional way on the Si wafer, as described in more detail in the following Examples. On the thus obtained surface, then a layer of the III/V semiconductor according to the invention is deposited. For this purpose, an inert gas flow ($H_2$) is loaded with the various educts. The following educts are used: trimethylgallium or triethylgallium, trialkylindium (as far as applicable), 1,1-dimethylhydrazine, tertiarybutylarsine, tertiarybutylphosphine and trimethylantimony (as far as applicable). All these educts are, for instance, available from Akzo Nobel HPMO.

For the production of a semiconductor layer according to the invention having an exemplary composition $Ga(N_{0.037}As_{0.883}P_{0.08})$, the following conditions were selected with a total reactor pressure of 50 hPa: partial pressures TEGa (triethylgallium) 0.007 hPa, TBAs (tertiarybutylarsine) 0.142 hPa, TBP (tertiarybutylphosphine) 0.035 hPa and UDMHy (dimethylhydrazine) 0.85 hPa. Therefrom result the following ratios: ratio As/Ga 20, ratio P/Ga 5 and ratio N/As 6.

The loaded $H_2$ carrier gas having a total pressure of 50 hPa is then conducted for 22 s over the surface of the coated substrate heated to 575° C. A layer according to the invention having a thickness of 7.0 nm is obtained. After expiration of the exposure period for the semiconductor layer according to the invention, the MOVPE system is adjusted to the deposition conditions of the respective barrier or adaptation layer.

Example 2

Production of an Optically Active Element

In the MOVPE apparatus of Example 1, first the layers described in the following examples are epitaxially grown on a Si wafer in a conventional manner. Thereafter, alternating barrier layers and quantum well layers are deposited, and the deposition of a barrier layer represents the completion. This periodic layer structure comprises in total 5 quantum well layers. As the quantum well layer, a layer according to Example 1 is used. All quantum well layers have the same composition. As the barrier layer, GaP is used. All barrier layers have the same composition. The quantum well layers have thicknesses between 2 and 20 nm each. The barrier layers have thicknesses between 5 and 500 nm.

Example 3

Monolithic Integrated Semiconductor Structure According to the Invention

A monolithic integrated semiconductor structure according to the invention is shown in FIG. 1. For the production, the layers B1) to F2) are subsequently epitaxially grown on a Si wafer A. The layer B1) is p-doped GaP. Zinc or magnesium is used as the doping element. The doping concentration is typically $1 \cdot 10^{18}$ cm$^{-3}$. The layer thickness of the layer B1) is 5-300 nm. The layer B1) is a contact layer, which is also current conducting. Thereafter, the layer B2) is produced, which is formed of p-doped (AlGa)P. Doping is made with zinc or magnesium in a doping concentration of typically $1 \cdot 10^{18}$ cm$^{-3}$. The aluminum concentration is more than 15 mole-%, referred to the total amount of group III elements. A typical value is in the range of 15-45 mole-%. Alternatively, p-doped (AlGa)(NP) can also be used, and the above applies with regard to doping and aluminum content. The share of nitrogen referred to in the total amount of group V elements, is 0-4 mole-%. The layer thickness is between 500 and 1,500 nm. The layer B2) is a waveguide layer, which acts at the same time as a current-conducting layer. The layer C) disposed thereupon is composed of undoped GaP. The layer thickness is 50-100 nm. It is a separate confinement heterostructure similar to a barrier layer. Further, the layer C) acts as an adaptation layer. For better visibility, the optically active element D) disposed thereupon is shown as a single layer. In fact, the layer D) is a layer structure according to Example 2. The layer E) corresponds to the layer C). Alternatively, both layers can also be adapted as Ga(NP), (GaIn)(NP) or (GaIn)(NaSP) layers. The nitrogen share referred to the group V elements may be 0-10 mole-%. In the case of the latter layer, the share of In referred to the total amount of group III elements may be 0-15 mole-%. The layer F1) corresponds to the layer B2), and the layer F2) corresponds to the layer B1), with the difference that the layers F1) and F2) are n-doped. As the doping element, tellurium with a doping concentration of typically $2 \cdot 10^{18}$ cm$^{-3}$ is employed. The layer thicknesses of the layers E), F1) and F2) correspond to the layer thicknesses of the layers C), B2) and B1) (in a reflection-symmetric order with regard to the optically active element).

For improving the degree of output coupling, for luminescence diodes as optically active elements, in addition (AlGa)/P/(AlGa)/P periodic reflection structures (DBR structures) having different aluminum contents can be incorporated in the current-conducting layer located under the optically active element. The aluminum share of successive layers is different and is, referred to the total amount of group III elements, 0-60 mole-% or 40-100 mole-%, resp. Alternatively, (AlGa)(NP) individual layers may also be used for the compensation of stress of these DBR structures, and the Al contents are to be selected as above, and the N contents from 0-4 mole-%, referred to the total amount of group V elements.

For surface emitting laser diodes (VCSEL) as optically active elements, the optically active element is enclosed from below, as well as from above, by a reflection structure of the above type. For current supply, either these two DBR mirror structures may be n-doped or p-doped, or additionally so-called intra cavity current contacts are introduced in the overall structure, said contacts permitting to produce the two DBR mirrors in an undoped condition.

Example 4

Fundamental Energy Gap of a Semiconductor According to the Invention

Figure 2:
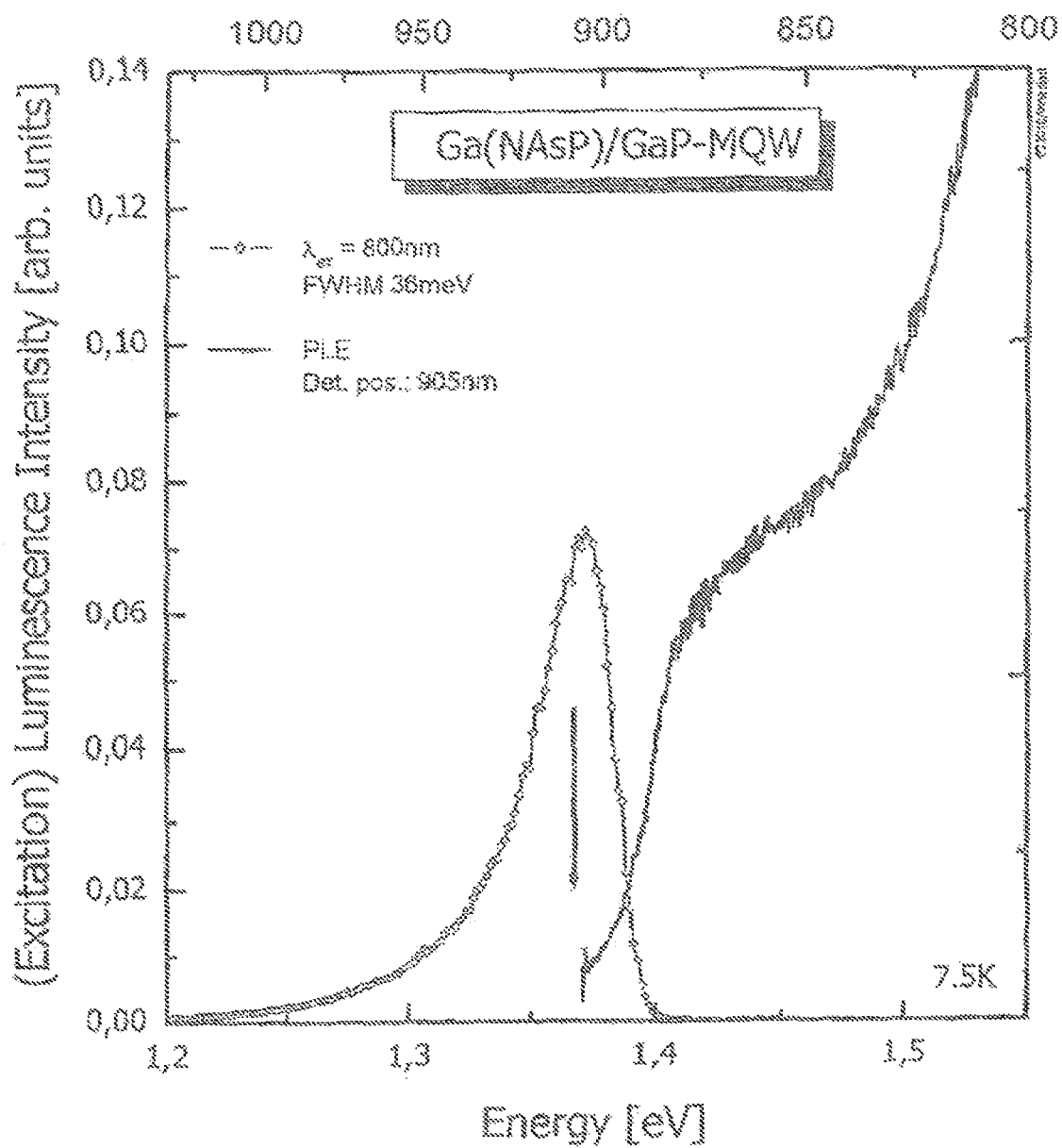
FIG. 2 shows the results of photoluminescence excitation spectroscopy.

A semiconductor layer produced according to Example 1 with 4 mole-% nitrogen, 90 mole-% arsenic and 6 mole-% phosphorus, referred to the total amount of group V elements, was investigated by means of the photoluminescence excitation spectroscopy. The result is shown in FIG. 2. The fundamental energy gap is approx. 1.4 eV. This value is clearly lower than the value of 1.8 eV modeled without the nitrogen interaction and shows the drastic influence of the energy gap by the incorporation of nitrogen in coordination with the further shares of other components in the semiconductor system according to the invention.

Example 5

Dislocation-Free Structure of Optically Active Elements According to the Invention An optically active element produced according to Example 2 was investigated by means of the high-resolution x-ray diffraction (HR-XRD) and of the transmission electron microscopy (TEM).

Figure 3:
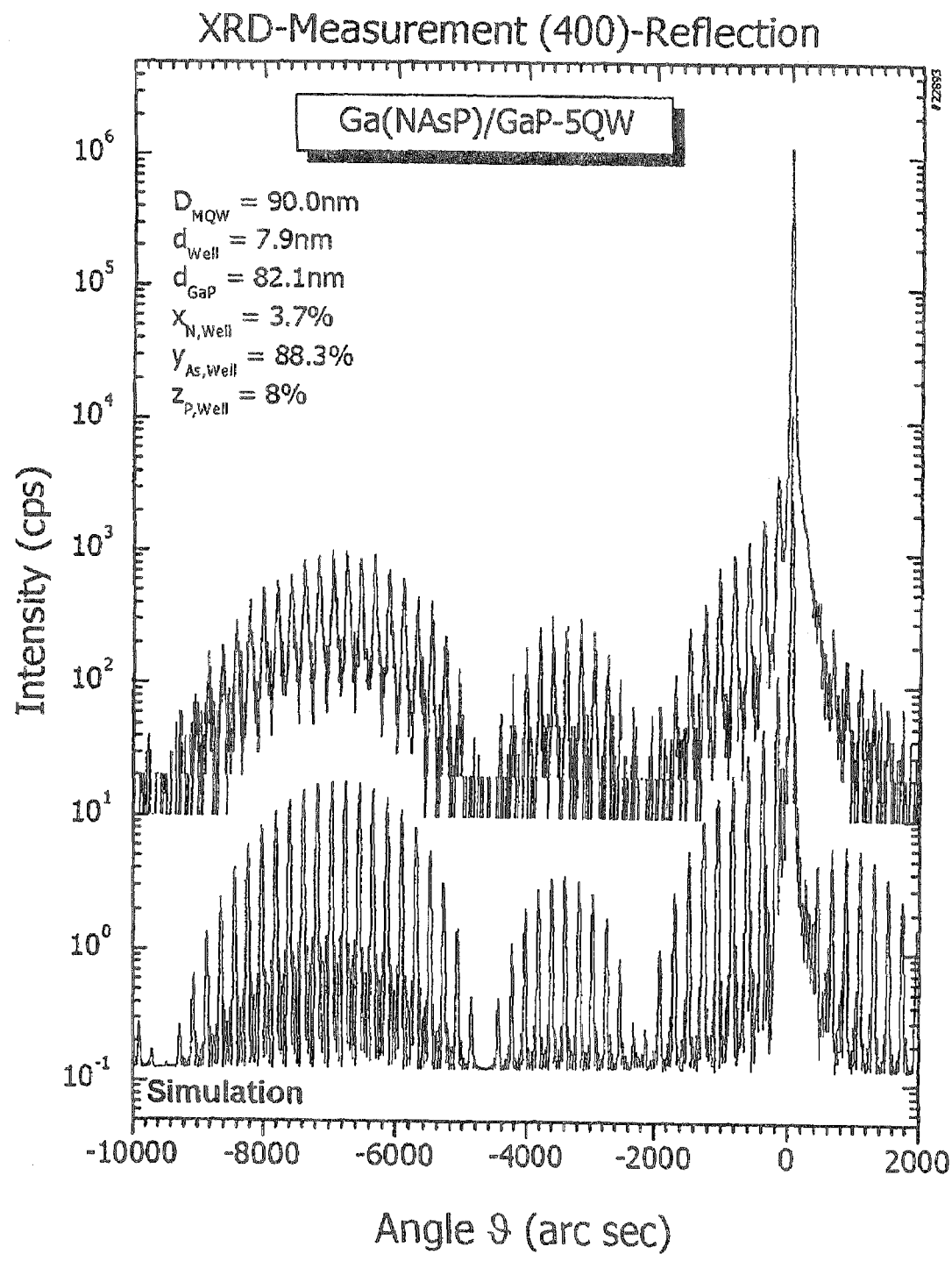
FIG. 3 shows an experimental HR-XRD profile (FIG. 3 top) in comparison with a theoretical profile according to the dynamic x-ray diffraction theory (FIG. 3 bottom).

FIG. 3 shows an experimental HR-XRD profile (FIG. 3 top) in comparison with a theoretical profile according to the dynamic x-ray diffraction theory (FIG. 3 bottom). The observed sharpness of the individual diffraction reflexes and the nearly perfect match of the experimental and theoretical diffraction profiles confirm the outstanding structural layer quality over a large area without generation of dislocations.

Figure 4:
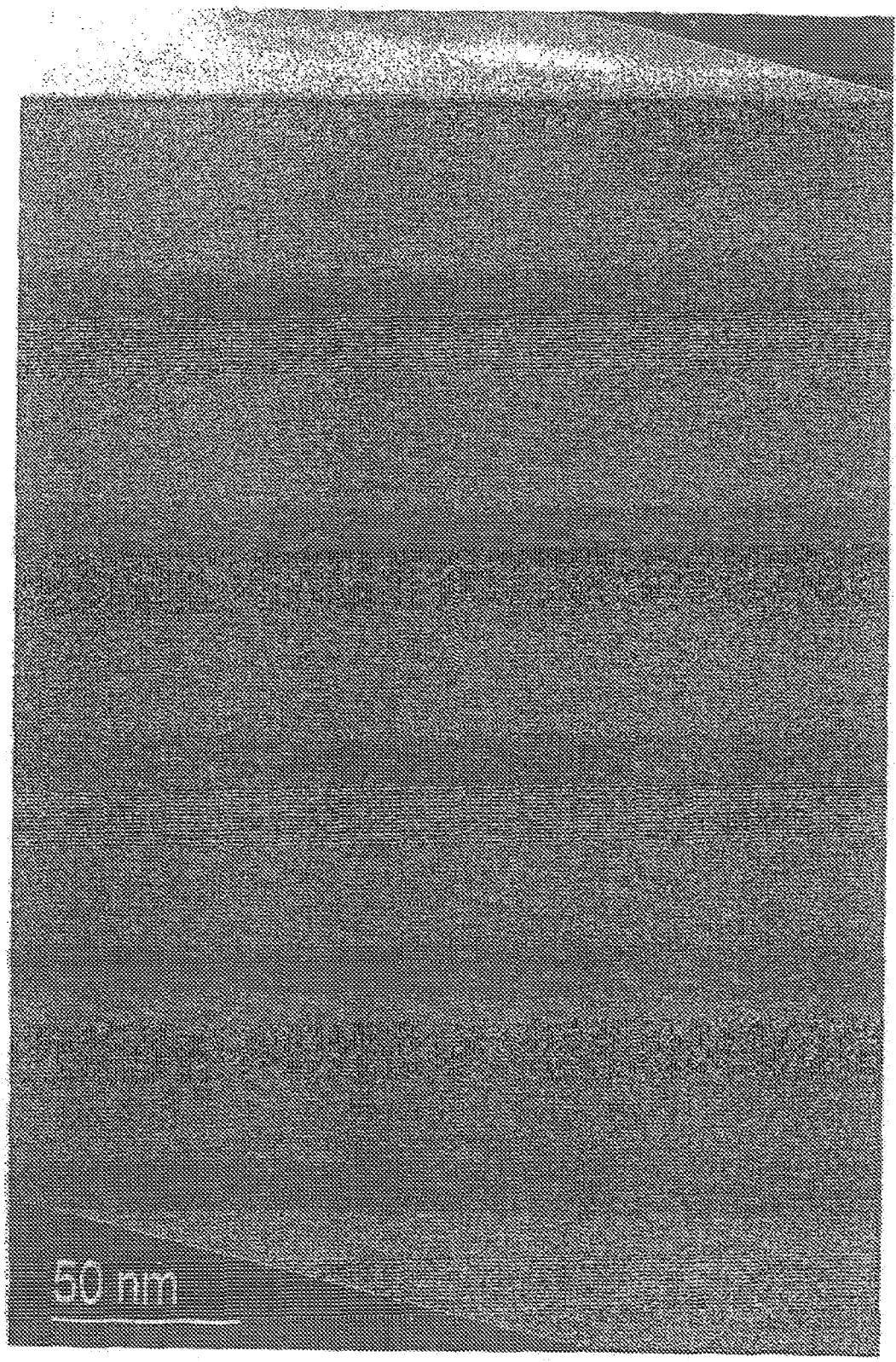
FIG. 4 shows a TEM dark field image.
Figure 5:
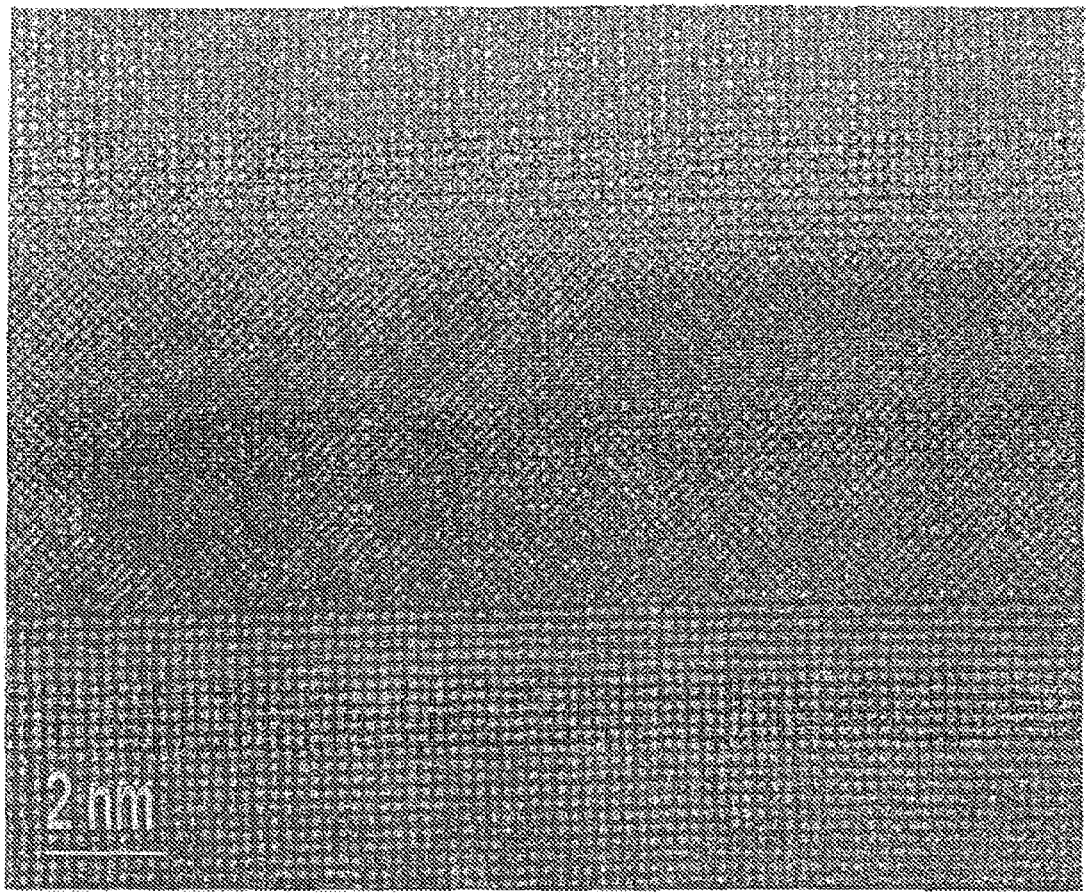
FIG. 5 shows a high resolution TEM image.

FIG. 4 shows a TEM dark field image. There can be seen pentanary layers according to the invention as dark layers. The lighter layers are Ga(NP) barrier layers. All three layers are clearly resolved, and there cannot be seen any large-area defects in the crystalline structure. In the high-resolution TEM image of FIG. 5, there are nearly atomically abrupt border faces at the transition of the (dark) pentanary layer according to the invention to the barrier layer, said border faces being free from dislocations and the like.

Example 6

Semiconductors with A Particularly Low Fundamental Energy Gap

Different semiconductor layers produced analogously to Example, said layers however containing nitrogen in the range of 5.5 to 11 mole-% (as always, referred to the total amount of group V elements), show in the investigation by means of photoluminescence spectroscopy at 20° C. a fundamental, direct energy gap of less than 1.2 eV, even less than 1.1 eV, which is below the energy gap of silicon (1.124 eV). Semiconductor layers having an energy gap below that of silicon, in particular for the production of luminescence and laser diodes, which are integrated with Si/SiO$_2$-based waveguide structures. In particular for these emission energies, there will namely be no absorption and thus attenuation of the light signal in the waveguide structure.

The invention claimed is:
1. A monolithic integrated semiconductor structure comprising the following layer structure:
   A) a carrier layer on the basis of doped or undoped Si or GaP,
   B) an optically active element comprising a semiconductor layer formed from a III/V semiconductor having the composition Ga$_x$In$_y$N$_a$As$_b$P$_c$Sb$_d$, wherein x=70-100 mole-%, y=0-30 mole-%, a=0.5-15 mole-%, b=67.5-99.5 mole-%, c=0-39.5 mole-% and d=0-15 mole-%, wherein the total of x and y is always 100 mole-%, wherein the total of a, b, c and d is always 100 mole-%, and wherein the ratio of the totals of x and y on the one hand and of a to d on the other hand is substantially 1:1.
2. A semiconductor structure according to claim 1, further comprising a second current-conducting layer formed over the optically active element, said second current conducting layer being composed of doped Si, doped GaP or doped (AlGa)P.

3. A semiconductor structure according to claim 1, further comprising a first p-doped or n-doped current conducting layer formed between the carrier layer and the optically active element.

4. A semiconductor structure according to claim 1, wherein y=1 to 30 mole-%.

5. A semiconductor structure according to claim 1, wherein c=1 to 32.0 mole-%.

6. A semiconductor structure according to claim 1, wherein the semiconductor is a direct semiconductor.

7. A semiconductor structure according to claim 2, further comprising a first p-doped or n-doped current conducting layer formed between the carrier layer and the optically active element, wherein the second conducting layer layer is p-doped if the first conducting layer is n-doped, and wherein the second conducting layer is n-doped if the first conducting layer is p-doped.

8. A semiconductor structure according to claim 1, wherein the optically active element has a layer structure $(D1\text{-}D2\text{-}D3)_n$, wherein the layer D2 is a quantum well layer of the said semiconductor, wherein the layers D1 and D3 are barrier layers, and wherein a number of layer periods n is between 1 and 50.

9. A semiconductor structure according to claim 8, further comprising a barrier layer D4 following one of the layers D1 or D3.

10. A semiconductor structure according to claim 8, wherein the barrier layers are semiconductors having the composition $Ga_pIn_qN_rP_sAs_t$, wherein p=85-100 mole-%, q=0-15 mole-%, r=0-15 mole-%, s=60-100 mole-% and t=0-40 mole-%, wherein the total of p and q is always 100 mole-%, wherein the total of r, s and t is always 100 mole-%, wherein the ratio of the totals of p and q on the one hand, and of r to t on the other hand, is substantially 1:1, and wherein the barrier layer has a layer thickness of preferably 5-50 nm.

11. A semiconductor structure according to claim 1, wherein the first and/or the second adaptation layers are semiconductors having the composition $Ga_pIn_qN_rP_sAs_t$, wherein p=90-100 mole-%, q=0-10 mole-%, r=0-10 mole-%, s=70-100 mole-% and t=0-30 mole-%, wherein the total of p and q is always 100 mole-%, wherein the total of r, s and t is always 100 mole-%, and wherein the ratio of the totals of p and q on the one hand, and of r to t on the other hand, is substantially 1:1, and wherein the adaptation layer has a layer thickness of preferably 50-500 nm.

12. A semiconductor structure according to claim 1, wherein a current-conducting layer and/or barrier layer disposed between the carrier layer and the optically active element is at the same time an adaptation layer.

13. A semiconductor structure according to claim 1, wherein underneath and/or above the optically active element, at least one optical waveguide layer is provided, which is optically coupled to the optically active element.

14. A semiconductor structure according to claim 2, further comprising at least one periodic reflection structure between the layers A) and B) and/or outside the second conducting layer.

15. A semiconductor structure according to claim 1, wherein the optically active element has a fundamental emission wavelength in the range of 700-1,100 nm.

16. A method for the production of a monolithic integrated semiconductor structure according to claim 8,
wherein on a carrier layer A on the basis of doped or undoped Si or GaP,
optionally a first current-conducting layer B consisting of doped Si, doped GaP or doped (AlGa)P is epitaxially grown,
optionally a first adaptation layer C is epitaxially grown, and
a multi-layer structure D, which forms an optically active element including a semiconductor layer comprising a semiconductor according to one of claims 1 to 6, is epitaxially grown.

17. A method according to claim 16, wherein on the optically active element optionally a second adaptation layer E is epitaxially grown, and on the optically active element or the second adaptation layer a second current-conducting layer F consisting of doped Si or doped GaP or doped (AlGa)P is epitaxially grown.

18. A method according to claim 16, wherein the layer B is p-doped or n-doped.

19. A method according to claim 18, wherein the layer F) is p-doped, if the layer B) is n-doped, and wherein the layer F) is n-doped, if the layer B) is p-doped.

20. A method according to claim 16, wherein the optical element is formed by epitaxial growth of layers D1, D2 and D3, wherein the order of the epitaxial steps is performed such that the layer structure is $(D1\text{-}D2\text{-}D3)_n$, wherein the layer D2 is a quantum well layer of a semiconductor according to one of claims 1 to 4, wherein the layers D1 and D3 are barrier layers, and wherein n=1-50, in particular 1-15.

21. A method according to claim 20, wherein following one of the terminal layers D1 or D3, a barrier layer D4 is epitaxially grown.

22. A method according to claim 20, wherein the barrier layers are semiconductors having the composition $Ga_pIn_qN_rP_sAs_t$, wherein p=85-100 mole-%, q=0-15 mole-%, r=0-15 mole-%, s=60-100 mole-% and t=0-40 mole-%, wherein the total of p and q is always 100 mole-%, wherein the total of r, s and t is always 100 mole-%, wherein the ratio of the totals of p and q on the one hand and of r to t on the other hand is substantially 1:1, and wherein the barrier layer has a layer thickness of preferably 5-50 nm.

23. A method according to claim 16, wherein the first and/or second adaptation layers are semiconductors having the composition $Ga_pIn_qN_rP_sAs_t$, wherein p=90-100 mole-%, q=0-10 mole-%, r=0-10 mole-%, s=70-100 mole-% and t=0-30 mole-%, wherein the total of p and q is always 100 mole-%, wherein the total of r, s and t is always 100 mole-%, wherein the ratio of the totals of p and q on the one hand and of r to t on the other hand is substantially 1:1, and wherein the adaptation layer has a layer thickness of preferably 50-500 nm.

24. A method according to claim 16, wherein a current-conducting layer and/or barrier layer disposed between the carrier layer and the optically active element is at the same time an adaptation layer.

25. A method according to claim 16, wherein underneath and/or above the optically active element, at least one optical waveguide layer is provided, which is optically coupled to the optically active element.

26. A method according to claim 16, wherein between the layers A) and D) and/or outside the layer F), there is provided at least one periodic reflection structure.

27. A method according to claim 16, wherein the optically active element has a fundamental emission wavelength in the range of 700-1,100 nm.

28. III/V semiconductor having the composition $Ga_xIn_yN_aAs_bP_cSb_d$, wherein x=70-100 mole-%, y=0-30 mole-%, a=0.5-15 mole-%, b=67.5-99.5 mole-%, c=0-39.5 mole-% and d=0-15 mole-%, wherein the total of x and y is always 100 mole-%, wherein the total of a, b, c and d is always 100 mole-%, and wherein the ratio of the totals of x and y on the one hand and of a to d on the other hand is substantially 1:1, wherein y=1 to 30 mole-%.

29. A III/V semiconductor having the composition $Ga_xIn_yN_aAs_bP_cSb_d$, wherein x=70-100 mole-%, y=0-30 mole-%, a=0.5-15 mole-%, b=67.5-99.5 mole-%, c=0-39.5 mole-% and d=0-15 mole-%, wherein the total of x and y is always 100 mole-%, wherein the total of a, b, c and d is always 100 mole-%, and wherein the ratio of the totals of x and y on the one hand and of a to d on the other hand is substantially 1:1, wherein c=1-32.0 mole-%.

30. A III/V semiconductor having the composition $Ga_xIn_yN_aAs_bP_cSb_d$, wherein x=70-100 mole-%, y=0-30 mole-%, a=0.5-15 mole-%, b=67.5-99.5 mole-%, c=0-39.5 mole-% and d=0-15 mole-%, wherein the total of x and y is always 100 mole-%, wherein the total of a, b, c and d is always 100 mole-%, and wherein the ratio of the totals of x and y on the one hand and of a to d on the other hand is substantially 1:1, wherein the layer thickness of the semiconductor layer is in the range from 1-50 nm, preferably 2-20 nm.

31. A method for the production of a semiconductor layer according to claim 30 comprising the following steps:
    a substrate on the basis of doped or undoped Si or GaP is brought into a MOVPE apparatus,
    optionally a surface of the substrate is provided in at least one epitaxial coating step first with respectively at least one adaptation layer, one barrier layer, one current-conducting layer, one waveguide layer and/or one reflection structure,
    an inert carrier gas is loaded with educts in defined concentrations, the loaded carrier gas is conducted over the surface of the substrate heated to a temperature in the range of 300° C. to 700° C. or on the surface of the uppermost layer on the substrate for a defined duration of exposure, and the total concentration of the educts and the duration of exposure are adjusted to each other such that the semiconductor layer is epitaxially formed with a given layer thickness on the surface of the substrate or on the surface of the uppermost layer on the substrate.

32. A method according to claim 31, wherein the following educts are used: C1-C5 trialkylgallium, in particular triethylgallium ($Ga(C_2H_5)_3$) and/or trimethylgallium ($Ga(CH_3)_3$), as a Ga educt, optionally C1-C5 trialkylindium, in particular trimethylindium ($In(CH_3)_3$), as an In educt, ammonia ($NH_3$), mono($C_1$-$C_8$)alkylhydrazine, in particular tertiarybutylhydrazine (t-($C_4H_9$)—NH—$NH_2$), and/or 1,1-di(C1-C5)alkylhydrazine, in particular 1,1-dimethylhydrazine (($CH_3$)$_2$—N—$NH_2$), as an N educt, arsine ($AsH_3$) and/or C1-C5 alkylarsine, in particular tertiarybutylarsine (t-($C_4H_9$)—$AsH_2$), as an As educt, phosphine ($PH_3$) and/or C1-C5 alkylphosphine, in particular tertiarybutylphosphine (t-($C_4H_9$)—$PH_2$), as a P educt, and optionally C1-C5 trialkylantimony, in particular trimethylantimony ($Sb(C_2H_5)_3$) and/or triethylantimony ($Sb(CH_3)_3$), as an Sb educt, wherein the C3-C5 alkyl groups may be linear or branched.

33. A method according to claim 32, wherein the educts are employed in the following molar ratios:
    As educt/group III educts 5-300,
    P educt/group-III educts 0-500,
    N educt/As educt 0.1-10,
    optionally Sb educt/As educt 0-1,
    wherein the surface temperature of the substrate is adjusted to the range from 500° C. to 630° C., wherein the total pressure of carrier gas and educts is adjusted to the range from 10 to 200 hPa, wherein the ratio of the total of the partial pressures of the educts to the partial pressure of the carrier gas is between 0.005 and 0.1, and wherein the deposition rate is 0.1 to 10 μm/h.

34. A semiconductor layer obtainable with a method according to claim 31.

35. An integrated monolithic semiconductor structure obtainable with a method according to claim 16.

36. The use of a semiconductor layer according to claim 30 for the production of a luminescence diode, a VCSEL laser diode, a VECSEL laser diode, a modulator structure or a detector structure.

* * * * *